(12) United States Patent
Chen (10) Patent No.: US 10,891,190 B2
(45) Date of Patent: Jan. 12, 2021

(54) FLASH MEMORY AND OPERATION METHOD THEREOF

(71) Applicant: GigaDevice Semiconductor (Beijing) Inc., Beijing (CN)

(72) Inventor: Minyi Chen, Beijing (CN)

(73) Assignee: GigaDevice Semiconductor (Beijing) Inc., Beijing (CN)

(*) Notice: Subject to any disclaimer, the term of this patent is extended or adjusted under 35 U.S.C. 154(b) by 0 days.

(21) Appl. No.: 16/275,554

(22) Filed: Feb. 14, 2019

(65) Prior Publication Data
US 2020/0210285 A1    Jul. 2, 2020

(30) Foreign Application Priority Data

Dec. 30, 2018  (CN) .......................... 2018 1 1644297

(51) Int. Cl.
| | | |
|---|---|---|
| *G06F 11/10* | (2006.01) | |
| *G11C 16/04* | (2006.01) | |
| *G11C 16/26* | (2006.01) | |
| *G11C 16/10* | (2006.01) | |
| *G11C 29/52* | (2006.01) | |
| *G11C 16/34* | (2006.01) | |
| *H01L 27/11524* | (2017.01) | |
| *G11C 11/56* | (2006.01) | |

(52) U.S. Cl.
CPC ...... *G06F 11/1068* (2013.01); *G11C 16/0483* (2013.01); *G11C 16/10* (2013.01); *G11C 16/26* (2013.01); *G11C 16/3459* (2013.01); *G11C 29/52* (2013.01); *G11C 11/5628* (2013.01); *G11C 11/5642* (2013.01); *H01L 27/11524* (2013.01)

(58) Field of Classification Search
CPC ....... H01L 25/0657; H01L 2225/06513; H01L 2225/0619; H01L 2225/06541; G11C 29/74; G11C 29/52; G11C 11/4093; G11C 2029/0409; G11C 11/407; G11C 5/04; G11C 2029/0401; G11C 2029/0411; G11C 29/70; G11C 11/1677; G11C 29/42; G11C 16/0483; G11C 16/10; G11C 16/26; G11C 16/3459; G11C 11/4096; G06F 11/1048; G06F 11/1068; G06F 3/0679; G06F 3/064; G06F 3/0619
See application file for complete search history.

(56) References Cited

U.S. PATENT DOCUMENTS

| 2017/0046223 | A1* | 2/2017 | Kern ...................... G11C 29/52 |
| 2017/0139771 | A1* | 5/2017 | Chung ................ G06F 11/1068 |
| 2019/0243708 | A1* | 8/2019 | Cha ..................... H01L 25/0657 |

* cited by examiner

*Primary Examiner* — Guerrier Merant
(74) *Attorney, Agent, or Firm* — Norton Rose Fulbright US LLP; James R. Crawford (57) ABSTRACT

Disclosed are a nonvolatile memory and an operation method thereof. The nonvolatile memory includes a memory cell array and a controller. The controller is configured to: read out raw data from a plurality of memory cells in the memory cell array; correct the raw data by using error correction code (ECC) data to obtain corrected data; determine an address of a memory cell having a data loss error in the plurality of memory cells; and program the memory cell having the data loss error. After the ECC correction in the read operation, the data loss error is corrected by a program operation.

17 Claims, 8 Drawing Sheets

FLASH MEMORY AND OPERATION METHOD THEREOF

CROSS-REFERENCE TO RELATED APPLICATIONS

This application claims priority to a Chinese patent application No 201811644297.X, filed on Dec. 30, 2018, the disclosure of which is incorporated herein by reference in its entirety.

TECHNICAL FIELD

Embodiments of the present disclosure relate generally to semiconductor memory devices. More particularly, embodiments of the present disclosure relate to a flash memory and a method for operating the flash memory.

BACKGROUND

Nonvolatile memory device is widely used for data storage applications, and becomes an indispensable component of modern electronic systems. Data stored in the nonvolatile memory is not lost when the power supply is removed. Flash memory is a representative nonvolatile memory device, and is divided into NOR flash memory and NAND flash memory in accordance with the memory cell configuration. NAND flash memory has excellent characteristics for integration. NAND flash memory has been generally employed in high density data storage, whereas NOR flash memory has typically been used for code storage.

Error Correction Code (ECC) has been used for detecting and correcting bit errors. The ECC circuit encodes source data in such a way that a decoder can identify and correct errors in the source data. Typically, the ECC circuit encodes the source data by generating a number of redundant bits (also referred to as ECC data) and adding these redundant bits to the source data. The source data and the ECC data are stored together in the flash memory. To balance die size cost and manufacturing yield, the ECC circuit has its correction capability limitation. Typically, the ECC circuit can fix 4 or 8 bits errors per 512 bytes data for NAND flash and 1 bit error per 8 bytes data for NOR flash, where 1 byte=8 bits. With the increasing of the capacity of the flash memory, the ECC correction capability needs to be extended.

SUMMARY

The following is a summary of a subject matter described herein in detail.

According to a first aspect of the present disclosure, a method for operating a flash memory is provided. The method includes: reading out raw data from a plurality of memory cells; correcting the raw data by using error correction code (ECC) data to obtain corrected data; determining an address of a memory cell having a data loss error in the plurality of memory cells; and programming the memory cell having the data loss error.

According to a second aspect of the present disclosure, a flash memory is provided. The flash memory includes: a memory cell array; and a controller. The controller is configured to: read out raw data from a plurality of memory cells in the memory cell array; correct the raw data by using error correction code (ECC) data to obtain corrected data; determine an address of a memory cell having a data loss error in the plurality of memory cells; and program the memory cell having the data loss error.

According to a third aspect of the present disclosure, a flash memory is provided. The flash memory includes: a page comprising a data region and an ECC region, a first buffer, a second buffer, a sensing circuit, and a controller. The sensing circuit is configured to read out raw data in the data region and ECC data in the ECC region and store the raw data and the ECC data in the first buffer. The ECC circuit is configured to correct the raw data by using the ECC data and store the corrected data in the second buffer. The controller is configured to determine an address of a memory cell having a data loss error in data region, and program the memory cell having the data loss error.

After the ECC correction of the read operation, data loss errors are corrected by a program operation, such that the ECC capability is increased without increasing the number of the ECC bits.

BRIEF DESCRIPTION OF DRAWINGS

The accompanying drawings are used for providing further understanding of the present disclosure and constitute a part of this specification. Elements and/or components in the figures are not necessarily drawn to scale.

DETAILED DESCRIPTION

Example embodiments of the present disclosure will be more clearly understood from the detailed description taken in conjunction with the accompanying drawings. Various example embodiments of the present disclosure will now be described more fully with reference to the accompanying drawings in which some example embodiments of the disclosure are shown. In the drawings, the sizes or configurations of elements may be idealized or exaggerated for clarity.

Detailed illustrative embodiments of the present disclosure are disclosed herein.

However, specific structural and functional details disclosed herein are merely representative for purposes of describing example embodiments of the present disclosure. This disclosure, however, may be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present disclosure. As used herein, the term "and/or" includes any and all combinations of one or more of the associated listed items.

It will be understood that when an element is referred to as being "connected" to another element, it can be directly connected to the other element or intervening elements may be present. In contrast, when an element is referred to as being "directly connected" to another element, there are no intervening elements present.

The terminology used herein is for the purpose of describing particular embodiments only and is not intended to be limiting of example embodiments of the disclosure. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this specification, and will not be interpreted in an idealized or overly formal sense unless expressly so defined herein.

Various embodiments of the present disclosure provide a flash memory. The flash memory may be NAND flash or NOR flash. The flash may be a single-level cell (SLC) flash, which just stores one binary bit per memory cell, a multi-level cell (MLC) flash, a trinary-level cell (TLC) flash, or a quad-level cell (QLC) flash. The NAND flash may be 2D NAND flash or 3D NAND flash. In the 3D NAND flash, the memory cells are stacked vertically in multiple layers.

Figure 1:
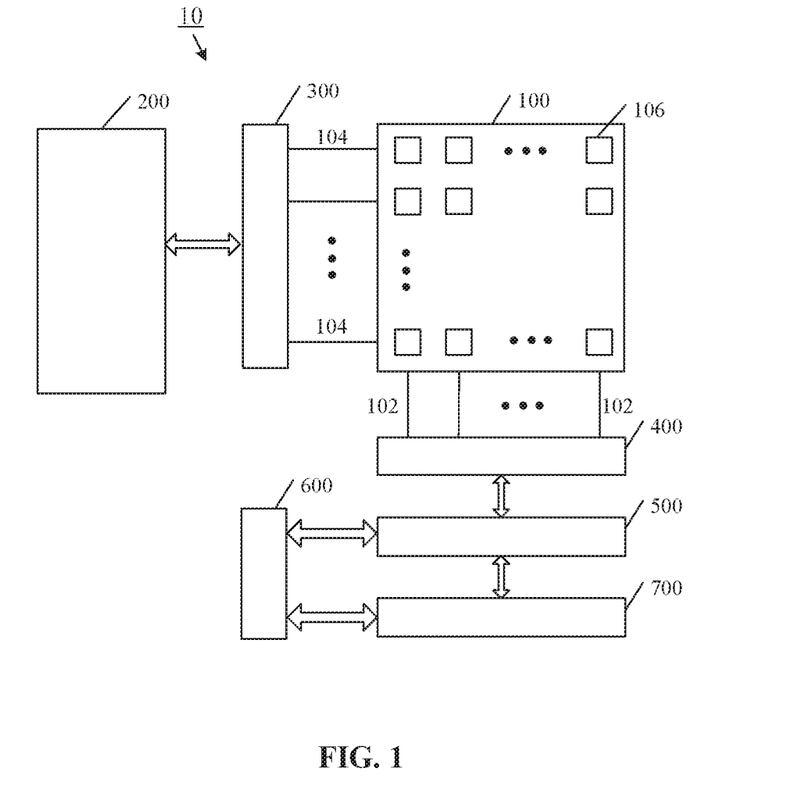
FIG. 1 is a simplified block diagram of a flash memory according to an embodiment of the present disclosure.

FIG. 1 is a simplified block diagram of a flash memory according to an embodiment of the present disclosure. As shown in FIG. 1, the flash memory 10 includes: a memory cell array 100, a controller 200, a row decoder 300, a sensing circuit 400, a sensing buffer 500, an ECC circuit 600, and a page buffer 700. The memory cell array 100 of the flash memory 10 includes a plurality of memory cells 106 which are addressed by bit lines 102 and word lines 104. Each memory cell 106 corresponds to one bit in SLC, two bits in MLC, three bits in TLC, four bits in QLC.

The controller 200 is connected to the row decoder 300, the sensing circuit 400, and the sensing buffer 500, the ECC circuit 600, and the page buffer 700. The controller 200 is further connected to a host (not shown). The controller 200 is configured to accept target data to be wrote into the memory cell array 100 from the host, and also configured to output data retrieved from the memory cell array 100 to the host.

The row decoder 300 is connected to the word lines 104. The sensing circuit 400 is connected to the bit lines 102. The row decoder 300 may be utilized in conjunction with a program voltage generation circuit and a read/verification voltage generation circuit. The program voltage generation circuit and the read/verification voltage generation circuit may be implemented by charge pumps. The row decoder 300 decodes an address signal received from the controller 200 to select one or more word lines 104 to which the program voltage or the read voltage or the verification voltage is sent. Typically, the verification voltage is slightly greater than the read voltage.

Figure 3:
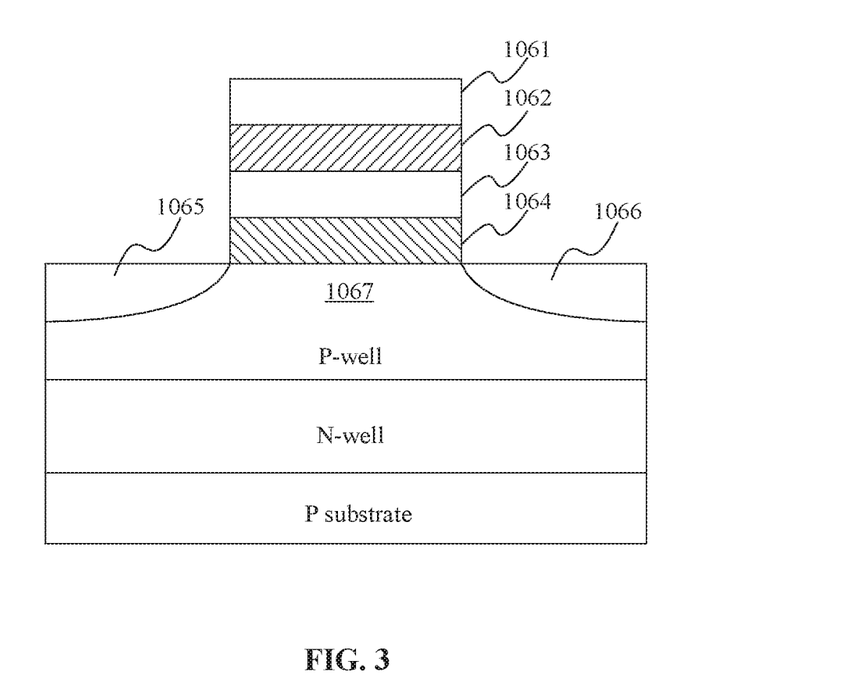
FIG. 3 is a schematic diagram of a memory cell.

The memory cell 106 may be implemented by a field-effect transistor. FIG. 3 is a schematic block diagram of the field-effect transistor placed in a triple-well structure. As shown in FIG. 3, the field-effect transistor includes a control gate 1061, a charge trapping layer 1063, a tunneling oxide layer 1064, a blocking oxide layer 1062, a source 1065, a drain 1066 and a channel region 1067. The tunneling oxide layer 1064 is interposed between the charge trapping layer 1063 and the channel region 1067. The blocking oxide layer 1062 is interposed between the control gate 1061 and the charge trapping layer 1063. The charge trapping layer may be a floating gate or a dielectric layer typically made of silicon nitride. The control gate 1061 is electrically connected to a corresponding word line 104.

Figure 2:
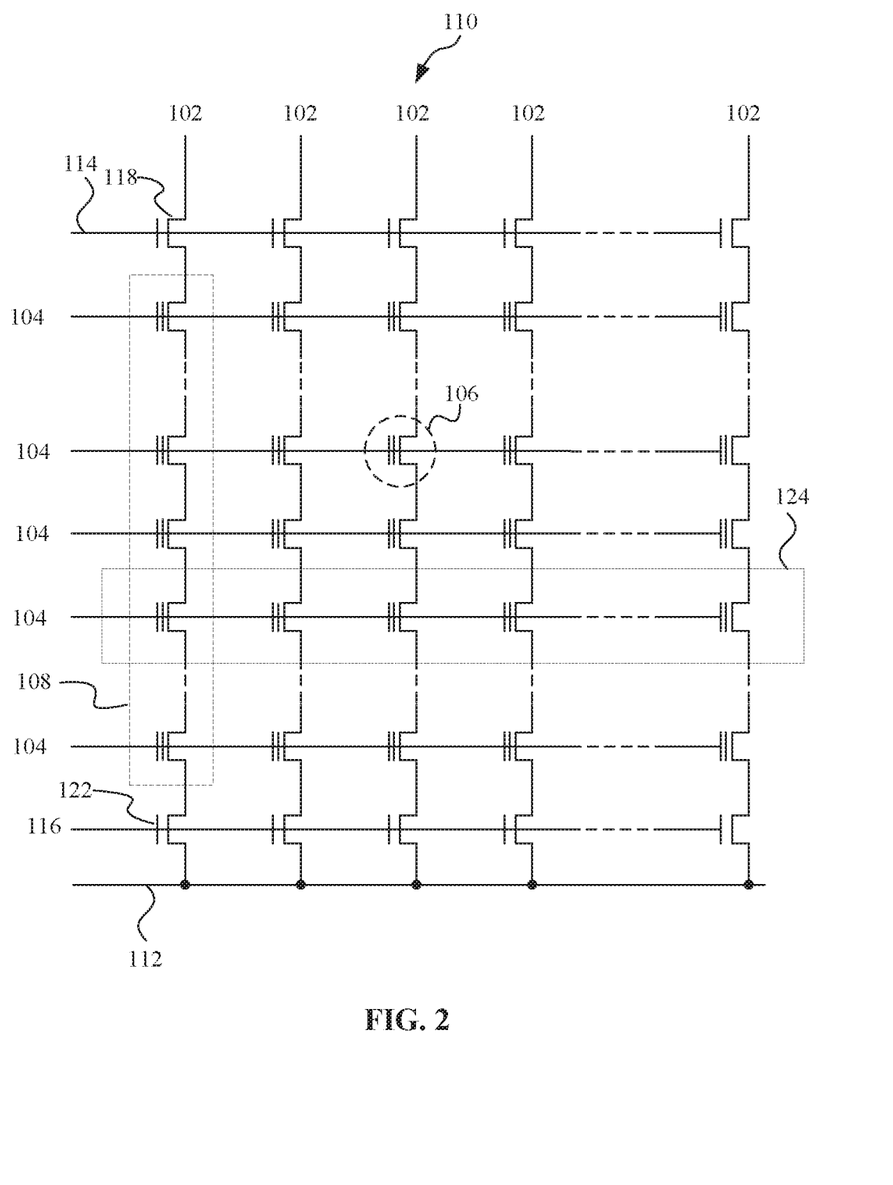
FIG. 2 is a schematic diagram of an exemplary configuration of a memory cell block of a NAND flash memory according to an embodiment of the present disclosure.

In a typical configuration of the NAND flash memory, the memory cell array 100 includes multiple blocks, each block includes multiple pages, and each page includes multiple memory cells 106. FIG. 2 shows an exemplary configuration of the memory cell block in the memory cell array 100 when the flash memory 10 in FIG. 1 is NAND flash. As shown in FIG. 2, in the block 110, the memory cells 106 are arranged in rows and columns, and the memory cells 106 in the column direction are connected in series to constitute a memory cell string 108. Specifically, the memory cells 106 in a same memory cell string 108 are daisy-chained by their sources and drains. Each memory cell string 108 is connected to a respective one of the bit lines 102 via a first select switch 118. Data stored in the memory cell 106 can be read via the bit line 102 by the sensing circuit 400. The first select switch 118 is controlled by a first control signal line 114. Each memory cell string 108 is further connected to a common source line 112 via a second select switch 122. The second select switch 122 is controlled by a second control signal line 116. The memory cells 106 in the row direction share a same word line 104, and constitute one page 124. In other words, control gates of the memory cells 106 in a same page are all connected to a same word line 104.

Figure 10:
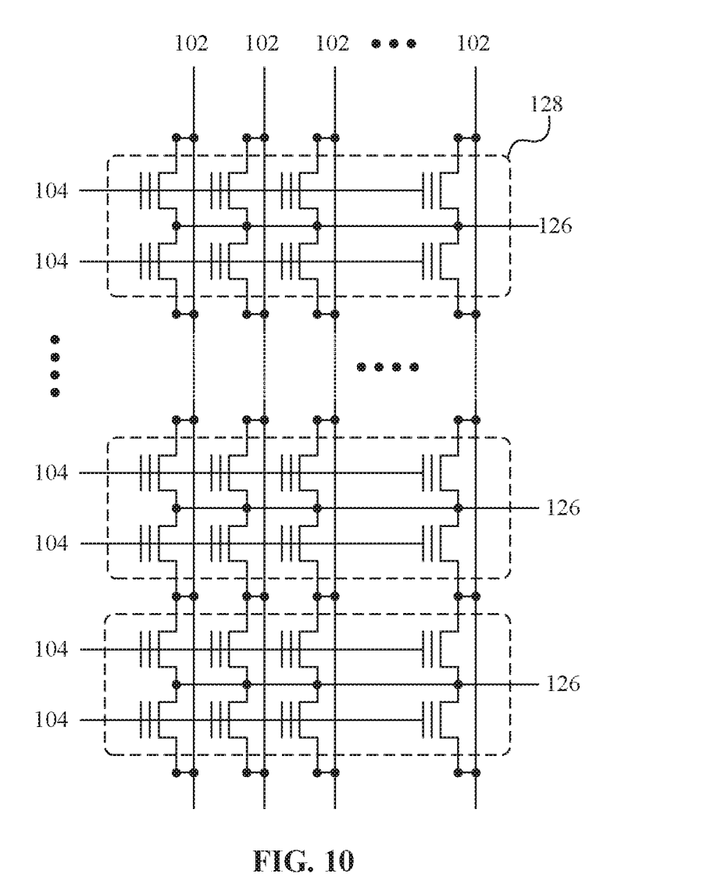
FIG. 10 is a schematic diagram of the memory cell array in a NOR flash memory.

FIG. 10 shows an exemplary configuration of a block of the memory cell array 100 when the flash memory 10 in FIG. 1 is NOR flash. As shown in FIG. 10, the memory cells 106 are arranged in rows and columns. The drain of each memory cell 106 is connected to a corresponding bit line 102, and the source of each memory cell 106 is connected to a source line 126. Specifically, drains of the memory cells 106 in the same column are connected to the same bit line 102. Control gates of the memory cells 106 in the same row are connected to the same word line 104. Every two adjacent rows of memory cells 106 form a sector 128. The source lines 126 are connected together. The columns of the block of the NOR flash include columns for storing user data, columns for storing ECC data, and redundant columns for replacing bad columns, for example a column connected to a broken bit line. The columns for storing user data may be divided into multiple pages.

Operations of the flash memory typically include program (write), erase and read. Briefly, the program operation is an action of adding electrons into the floating gate, whereas the erase operation is an action of moving the electrons from the floating gate to the channel region. In the program operation, a program voltage (e.g., 17-20V for NAND flash, 7-9V for NOR flash) is applied to the control gate 1061 of the memory cell 106 via the word line 104, and a voltage (e.g., 0V for NAND flash, 5V for NOR flash) is applied to the drain 1066 via the bit line 102, such that electrons in the channel region 1067 move into the charge trapping layer 1063 (by FN tunneling for NAND flash, source side hot-e injection for NOR flash) and are trapped in the charge trapping layer 1063. In the erase operation of the NAND flash, an erase voltage (e.g., example, 20V) is applied to the p-well and a voltage about 0V is applied to the control gate 1061 via the word line 104, such that electrons trapped in the charge trapping layer 1063 move back to the channel region 1067. In an exemplary erase operation of the NOR flash, an erase voltage (e.g., −8V) is applied to the control gate 1061 via the word line 104, a voltage (e.g., 7V) is applied to the source 1065 via the source line 126, and the bit line 102 is floating. Typically, for the NAND flash memory, the memory cell 106 has a positive threshold voltage in the programmed state and a negative threshold voltage in the erased state.

The program operation and the erase operation may be followed by a verification operation and a bit scan operation. The verification operation and the bit scan operation are used for determining whether the memory cells in the data region reach their correct states.

The read operation is to address the target memory cell within the memory cell array 100 and measure the information stored therein. Typically, the read operation is performed in page for the NAND flash. Continuing with reference to FIG. 1 and FIG. 2, in the read operation for NAND flash, the row decoder 300 selects the word line 104 connected to the selected page, and the read/verification voltage generation circuit generates a read voltage (e.g., 0-0.7V for SLC NAND flash) and applies the read voltage to the word line 104. A pass voltage (e.g., 4-7V for SLC NAND flash) is applied to other word lines in the block, such that other memory cells 106 in the same string 108 act as pass transistors. Another pass voltage is applied to the first control signal line 114 and the second control signal line 116, such that the first select switch 118 and the second select switch 122 are also turned on. Another voltage is applied to the common source line 112. The sensing circuit 400 measures the current flowing through the source 1065 and the drain 1066 of the memory cell 106 in the selected page. The sensing circuit 400 compares the magnitude of this current with a reference value to determine whether the memory cell 106 is conducting or non-conducting. If the threshold voltage of the memory cell 106 is above the read voltage, the memory cell 106 is still turned off and the magnitude of the current flowing through the channel of the memory cell 106 is smaller than the reference value, and accordingly, the memory cell 106 is considered as storing information "0". If the threshold voltage of the memory cell 106 is below the read operation and the magnitude of the current flowing through the channel of the memory cell 106 is larger than the reference value, the memory cell 106 is considered as storing information "1". In this way, the data stored in the selected page is read out by the sensing circuit 400 and stored in the sensing buffer 500.

For the NOR flash, the read operation may be performed on the entire row, or be performed on a part of the row corresponding to one or more pages. For example, when the read operation is performed on multiple memory cells in a selected row, where the multiple memory cells belong to the first page, a read voltage (e.g., 6.5 V) is applied to the word line 104 of the selected row, a voltage about 0V is applied to other word lines 104 in the block and also applied to the source lines 126, a voltage about 1V is applied to the bit lines connected to the multiple memory cells, and a voltage about 0V is applied to the bit lines connected to other memory cells in the data region of the selected row.

Figure 4:
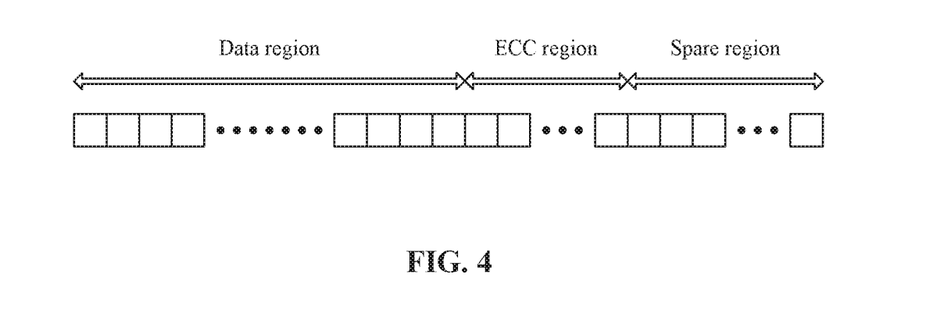
FIG. 4 is a schematic diagram of an exemplary configuration of a memory cell page of a NAND flash memory according to an embodiment of the present disclosure.

FIG. 4 shows an exemplary configuration of a page 124 of the NAND flash memory. Each block in FIG. 4 denotes a corresponding memory cell 106 in the page. The page 124 includes a data region (also referred to as main region), an error correction code (ECC) region and a spare region. Each row of the NOR flash may also include a data region and an ECC region. The spare region of the page 124 contains memory is used for storing firmware meta data (e.g., P/E count, address mapping). The data region is used for storing user data. Each memory cell in the data region represents a bit of the stored data. The ECC region is used for storing ECC data generated by the ECC circuit 600. ECC is used for correcting a limited number of bit errors within the user data stored in the data region. The most common ECC schemes for the NAND flash memory include BCH code, RS code, and Hamming code. The ECC circuit 600 corrects the user data using the ECC data and stores the corrected data in the page buffer 700. In an exemplary embodiment, the ECC circuit 600 may be integrated with the controller 200. The controller 200 may be a microprocessor, a micro controller unit (MCU), or an application specific integrated circuit (ASIC). The sensing buffer 500 and the page buffer 700 may be implemented by static random access memories (SRAMs).

The raw data may contain error bits caused by the following reasons, a memory cell was not correctly erased, a memory cell was not correctly programmed, a memory cell whose value is changed from 0 to 1 due to data loss effect, and a memory cell whose value is changed from 1 to 0 due to coupling effect. For the memory cell which was not correctly erased, its target value is 1 but the memory cell actually stores 0, and accordingly, the corresponding bit in the raw data is 0. For the memory cell which was not correctly programmed, its target value is 0 but the memory cell actually stores 1, and accordingly, the corresponding bit in the raw data is 1. In this disclosure, the data loss error bits correspond to the memory cell which was not correctly programmed and the memory cell whose value is changed from 0 to 1 due to data loss effect.

Data retention is a concept for characterizing the flash memory cell's ability of keeping the stored information with no biases applied, i.e. keeping the electrons trapped into the charge trapping layer 1063. However, even with no bias applied, electron after electron, charge loss of the charge trapping layer 1063 can lead to a read failure: a programmed cell can be read as erased if its threshold voltage shifts below 0 V in case of Single-Level-Cell (SLC), or towards a lower threshold level with respect to the initial threshold voltage in case of Multi-Level Cell (MLC). Such charge loss causes the stored information to change from "0" to "1". Herein, this type error is referred to as a data loss error, a memory cell whose stored information is changed from "0" to "1" is referred to as a memory cell having a data loss error, and a bit corresponding to the memory cell is referred to as a data loss error bit. It should be noted that the data loss error also includes the memory cell which was not corrected programmed.

In the flash memory, the threshold voltage of the memory cell may be unintentionally altered by a program operation performed on an adjacent memory cell, which is referred to as coupling effect or disturb effect. The threshold voltage of the memory cell may be increased due to the coupling effect, and therefore, the stored information may be changed from "1" to "0".

Figure 5:
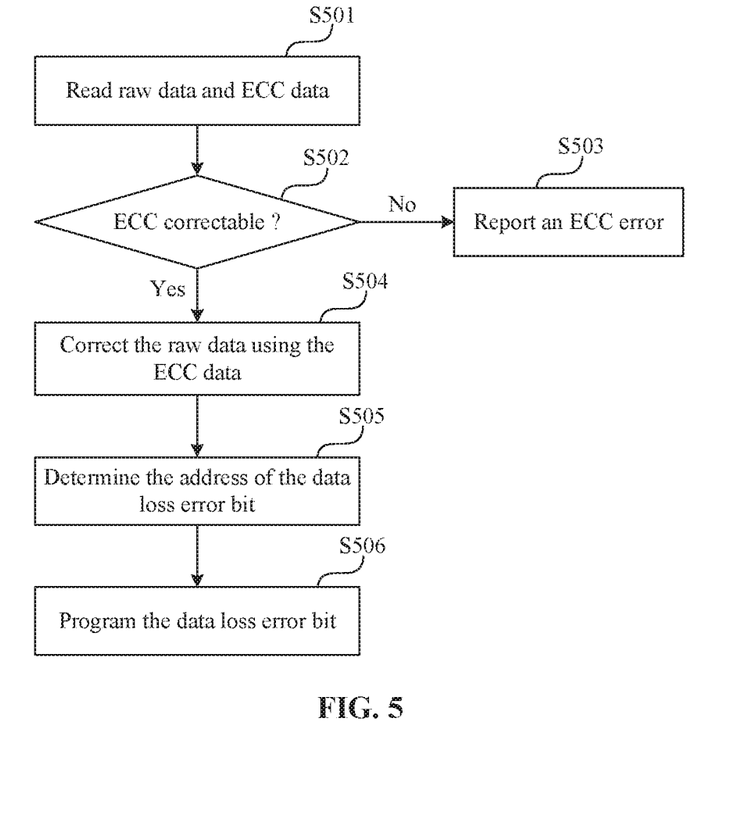
FIG. 5 is a flowchart of a method for operating the flash memory according to an embodiment of the present disclosure.
Figure 8:
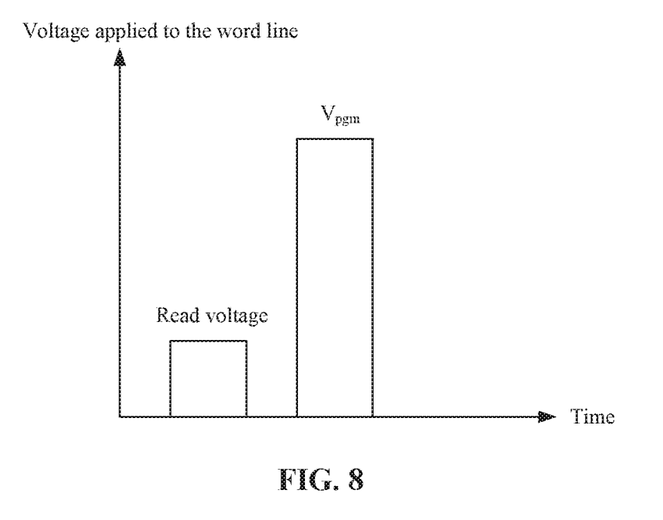
FIG. 8 is a schematic diagram illustrating the voltage applied to the word line of the selected page in the method for operating the flash memory according to an embodiment of the present disclosure.

Hereinafter, a method for operating the flash memory is provided. FIG. 5 is a flowchart of a method for operating the flash memory according to an embodiment of the present disclosure. FIG. 8 illustrates the voltage applied to the selected word line in the method shown in FIG. 5. This method may be a read operation. The controller 200 receives an instruction from the host, and sends an address signal to the row decoder 300. The row decoder 300 selects a word line 104 according to the address signal, and the read/verification voltage generation circuit generates a read voltage.

In step S501, the read voltage is applied to the selected word line 104, the sensing circuit 400 reads out the data stored in the data region as well as ECC data in the ECC region of the selected page, and stores the data read out form the data region and the ECC data in the sensing buffer 400. Herein, the data stored in the data region is referred to as raw data.

Figure 11:
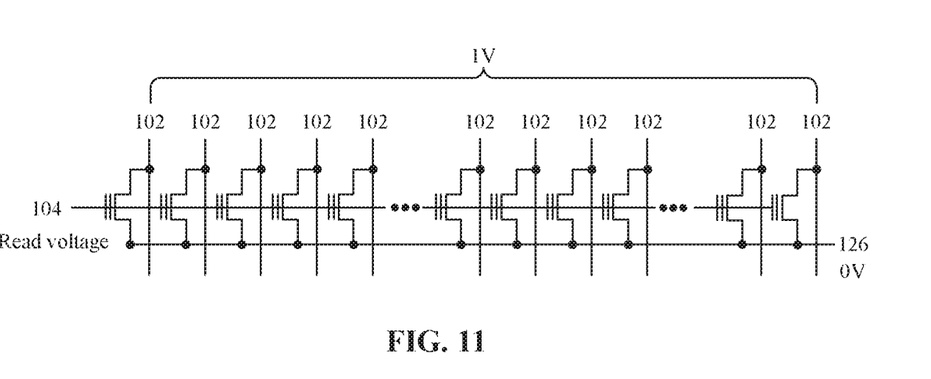
FIG. 11 is a schematic diagram of an exemplary bias configuration when a read operation is performed on the NOR flash memory.

FIG. 11 shows the bias configuration of the NOR flash in the read operation in step S501. As shown in FIG. 11, the read voltage is applied to the word line 104, a voltage about 1V is applied to the bit lines 102 and a voltage about 0V is applied to the source line 126.

In step S502, the ECC circuit 600 determines whether the error bits are correctable. Since the correction capability of the ECC scheme is limited and is determined by the number of bits of the ECC region. If the error bits in the raw data exceeds the correction capability of the ECC scheme, the error bits in the raw data cannot be fixed by the ECC circuit 600, and the method proceeds to step S503, in which the ECC circuit 600 reports an ECC error to the controller 200.

If the error bits in the raw data are within the correction capability of the ECC scheme, the method proceeds to step S504. In step S504, the ECC circuit 600 corrects the raw data using the ECC data by flipping the bit having the data loss error from 1 to 0 and flipping the bit unintentionally altered by the coupling effect from 0 to 1 so as to obtain corrected data, and stores the corrected data in the page buffer 500.

Figure 6:
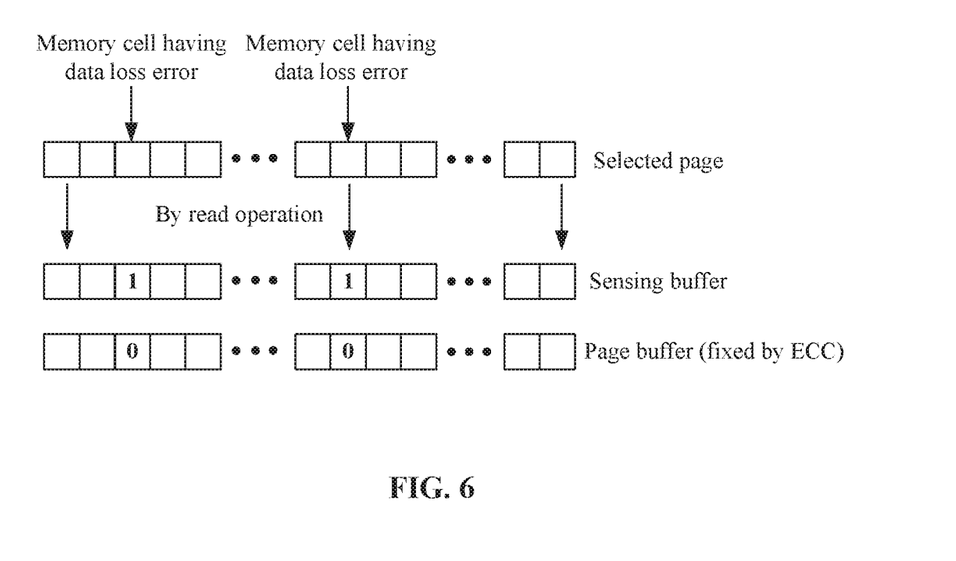
FIG. 6 is a schematic diagram illustrating a method for determining the data loss error bit.

In step S505, the address of the memory cell having a data loss error in the selected page is determined, that is, the address of the data loss error bit is determined. FIG. 6 show the data loss error bits in an example. As shown in FIG. 6, the bit in the raw data corresponding to the memory cell having the data loss error is 1, and the bit in the corrected data corresponding to the memory cell having the data loss error is 0. The controller 200 or the ECC circuit 600 finds the memory cells having a data loss error in the selected page by comparing the raw data in the sensing buffer 400 and the corrected data in the page buffer 700.

In step S506, the controller 200 causes the program voltage generation circuit to generate a program voltage $V_{pgm}$, and the program voltage $V_{pgm}$ is applied to the word line 104 connected to the selected page.

Figure 7:
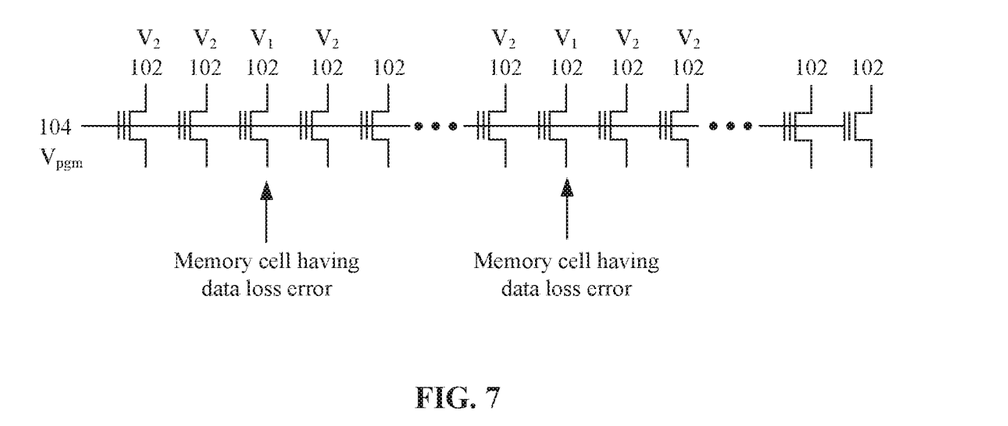
FIG. 7 is a schematic diagram illustrating the bias configuration when a memory cell having a data loss error is programmed.

FIG. 7 shows the bias configuration of the selected page of the NAND flash in step S506. As shown in FIG. 7, a voltage $V_1$ about 0V is applied to the bit lines 102 connected to the memory cells having a data loss error, and a program inhibit voltage $V_2$ is applied to other bit lines 102. In addition, a pass voltage is applied to other word lines in the same block. In an exemplary embodiment, the program voltage $V_{pgm}$ is less than the program voltage used in a previous program operation by which the raw data was programmed into the data region of the selected page. For example, the program voltage $V_{pgm}$ is less than 17V. In an exemplary embodiment, the program voltage $V_{pgm}$ is only one voltage pulse with a magnitude of 17 V, and the program operation is performed without verification.

Figure 12:
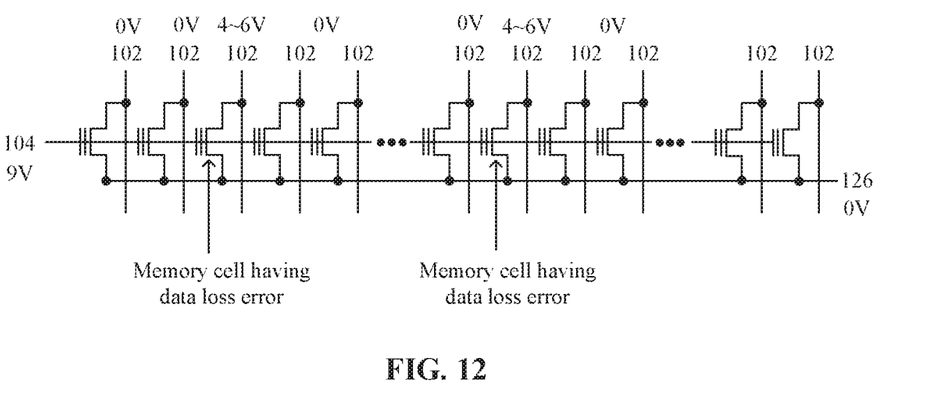
FIG. 12 is a schematic diagram of an exemplary bias configuration when a memory cell having a data loss error is programmed.

FIG. 12 shows the bias configuration for the NOR flash in step S506. As shown in FIG. 12, a program voltage $V_{pgm}$ about 7-9V is applied to the word line 104, a voltage about 0V is applied to the source line 126, a voltage about 4-6V is applied to the bit lines 102 connected to the memory cells having the data loss error, and a program inhibit voltage about 0V is applied to other bit lines 102. In addition, the voltage about 0V is applied to other word lines 104. In an exemplary embodiment, the program voltage $V_{pgm}$ is only one voltage pulse with a magnitude of 9 V.

Figure 9:
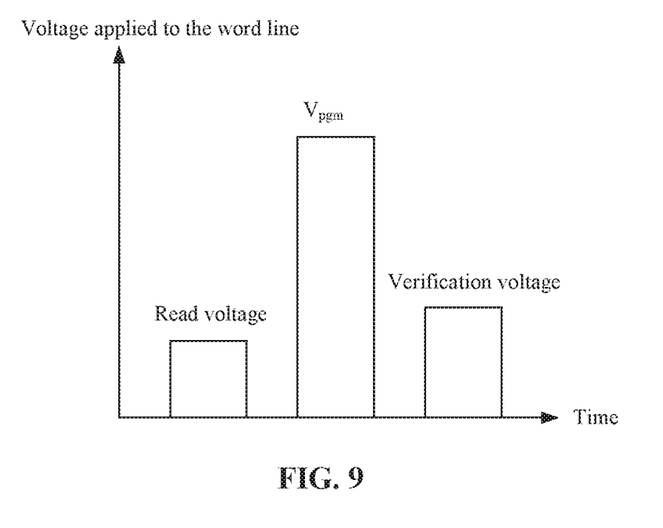
FIG. 9 is a schematic diagram illustrating the voltage applied to the word line of the selected page in the method for operating the flash memory according to another embodiment of the present disclosure.

In another embodiment, as shown in FIG. 9, after the step S506, a program verification is performed to determine whether the memory cell having a data loss error is correctly programmed. In the program verification, a verification voltage is applied to the word line, and the sensing circuit 400 measures the current flowing through the memory cell.

An embodiment of the present disclosure further provides a data storage product. The data storage product includes a processor, a power source, and the flash memory in the above embodiments.

In various embodiments, the nonvolatile memory is at least one of a multimedia card (MMC) card, a Secure Digital (SD) card, a micro SD card, a memory stick, an ID card, a PCMCIA card, a chip card, a USB card, a smart card, and a Compact Flash (CF) card.

The nonvolatile memory may be packaged by a Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (S SOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

While exemplary embodiments are described above, it is not intended that these embodiments describe all possible forms encompassed by the claims. The words used in the specification are words of description rather than limitation, and it is understood that various changes may be made without departing from the spirit and scope of the disclosure and claims. As previously described, the features of various embodiments may be combined to form further embodiments of the disclosure that may not be explicitly described or illustrated. While various embodiments may have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to: cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A method for operating a flash memory, comprising:
   reading out raw data from a plurality of memory cells;
   correcting the raw data by using error correction code (ECC) data to obtain corrected data;
   determining an address of a memory cell having a data loss error in the plurality of memory cells; and
   programming the memory cell having the data loss error,
   wherein the step of determining the address of the memory cell having the data loss error in the plurality of memory cells comprises: comparing the raw data and the corrected data, wherein a bit in the raw data corresponding to the memory cell having the data loss error is 1, and a bit in the corrected data corresponding to the memory cell having the data loss error is 0.

2. The method according to claim 1, further comprising: verifying whether the data loss error is corrected by the programming.

3. The method according to claim 1, wherein the ECC data is read out from the plurality of memory cells.

4. The method according to claim 1, wherein the step of programming the memory cell having the data loss error comprising: applying a program voltage to a word line connected to a control gate of the memory cell having the data loss error.

5. The method according to claim 4, wherein the program voltage is less than a program voltage used in a previous program operation by which the raw data was wrote into the plurality of memory cells.

6. The method according to claim 5, wherein the step of programming the memory cell having the data loss error comprising: applying one voltage pulse with a magnitude of 17V to a word line connected to a control gate of the memory cell having the data loss error.

7. A flash memory, comprising:
   a memory cell array; and
   a controller,
   wherein the controller is configured to:
   read out raw data from a plurality of memory cells in the memory cell array;
   correct the raw data by using error correction code (ECC) data to obtain corrected data;
   determine an address of a memory cell having a data loss error in the plurality of memory cells; and
   program the memory cell having the data loss error,
   wherein the controller determines the address of the memory cell having a data loss error in the plurality of memory cells by comparing the raw data and the corrected data, wherein a bit in the raw data corresponding to the memory cell having the data loss error is 1, and a bit in the corrected data corresponding to the memory cell having the data loss error is 0.

8. The flash memory according to claim 7, wherein the controller is further configured to verify whether the data loss error is corrected by the programming.

9. The flash memory according to claim 7, wherein the ECC data is read out from the plurality of memory cells.

10. The flash memory according to claim 7, wherein the controller programs the memory cell having the data loss error by applying a program voltage to a word line connected to a control gate of the memory cell having the data loss error.

11. The flash memory according to claim 10, wherein the program voltage is less than a program voltage used in a previous program operation by which the raw data is wrote into the plurality of memory cells.

12. The flash memory according to claim 10, wherein the program voltage is one voltage pulse with a magnitude of 17V.

13. A flash memory, comprising:
   a page comprising a data region and an ECC region;
   a sensing circuit, configured to read out raw data in the data region and ECC data in the ECC region and store the raw data and the ECC data in a first buffer;
   an ECC circuit, configured to correct the raw data by using the ECC data and store the corrected data in a second buffer; and
   a controller, configured to determine an address of a memory cell having a data loss error in data region, and program the memory cell having the data loss error,
   wherein the controller determines the address of the memory cell having a data loss error in the plurality of memory cells by comparing the raw data with the corrected data, wherein a bit in the raw data corresponding to the memory cell having the data loss error is 1, and a bit in the corrected data corresponding to the memory cell having the data loss error is 0.

14. The flash memory according to claim 13, wherein the controller programs the memory cell having the data loss error by applying a program voltage to a word line corresponding to the page, wherein the program voltage is less than a program voltage used in a previous program operation by which the raw data was wrote into the data region.

15. The flash memory according to claim 14, wherein the flash is a NAND flash, and the program voltage is one voltage pulse with a magnitude of 17V.

16. The flash memory according to claim 13, wherein when the controller programs the memory cell having the data loss error, the controller applies a program voltage to a word line corresponding to the page, applies a voltage of 0V to a bit line connected to the memory cell having the data loss error, and applies a program inhibit voltage to bit lines connected to memory cells in the data region other than the memory cell having the data loss error.

17. The flash memory according to claim 13, wherein the controller is further configured to verify whether the data loss error is corrected.

* * * * *